US005159418A

United States Patent [19]

Tokuno

[11] Patent Number: 5,159,418
[45] Date of Patent: Oct. 27, 1992

[54] CCD IMAGER WITH INTEGRATED VOLTAGE DIVIDER RESISTORS TO SUPPLY OVERFLOW DRAIN

[75] Inventor: Akihira Tokuno, Higashiosaka, Japan

[73] Assignee: Sharp Kabushiki Kaisha, Japan

[21] Appl. No.: 812,616

[22] Filed: Dec. 26, 1991

[30] Foreign Application Priority Data

Jan. 4, 1991 [JP] Japan .................................. 3-000020
Mar. 19, 1991 [JP] Japan .................................. 3-54390

[51] Int. Cl.$^5$ ..................... H01L 29/78; H01L 27/02; H01L 29/04
[52] U.S. Cl. ......................................... 357/24; 357/51; 357/59
[58] Field of Search ........................... 357/24, 51, 59 F

[56] References Cited

U.S. PATENT DOCUMENTS

| | | | |
|---|---|---|---|
| 4,178,519 | 11/1979 | Engeler et al. | 357/24 |
| 4,212,025 | 7/1980 | Hirasawa et al. | 357/51 |
| 4,225,877 | 9/1980 | Miles et al. | 357/59 F |
| 4,373,167 | 2/1983 | Yamada | 357/24 |
| 4,654,865 | 3/1987 | Sunasuka et al. | 357/51 |
| 5,065,221 | 11/1991 | Imamura | 357/51 |

*Primary Examiner*—Gene M. Munson
*Attorney, Agent, or Firm*—Nixon & Vanderhye

[57] ABSTRACT

A CCD type solid state imaging device is disclosed, in which the overflow drain voltage is generated within the device itself by dividing the drain voltage by a built-in divider. The divider is constituted by first and second resistive layers. The first resistive layer interconnects an input terminal and an overflow drain voltage supply. The second resistive layer interconnects the overflow drain voltage supply and a grounded region formed in the semiconductor substrate. Both or one of the first and second resistive layers are formed by a laser trimming technique for adjustment of the resistance ratio of the first resistive layer to said second resistive layer. As a result, the need for such troublesome voltage adjusting operation as may be otherwise required in the process of manufacturing video cameras or the like is eliminated.

4 Claims, 1 Drawing Sheet

CCD IMAGER WITH INTEGRATED VOLTAGE DIVIDER RESISTORS TO SUPPLY OVERFLOW DRAIN

BACKGROUND OF THE INVENTION

1. Field of the Invention

The present invention relates to a chargecouple type solid state imaging device (CCD type solid state imaging device). More particularly, the invention relates to a CCD type solid state imaging device used in a video camera or the like.

2. Description of the Prior Art

FIG. 2 shows a prior art CCD type solid state imaging device. This CCD type solid state imaging device comprises: a semiconductor substrate 1 having a grounded region; photoelectric conversion elements 2 arranged in a matrix pattern at the semiconductor substrate 1; vertical transfer elements 3 disposed adjacent to individual columns of the photoelectric conversion elements 2; a horizontal transfer element 4 connected to the ends of individual columns of the vertical transfer elements 3; and an output circuit 5 connected to one end of the horizontal transfer element 4. The CCD type solid state imaging device further comprises: a drain terminal 6 connected to a drain region (not shown) which is provided within the output circuit 5; an overflow drain voltage supply 8 formed in the semiconductor substrate 1; and an overflow drain voltage input terminal 7 connected to the overflow drain voltage supply 8.

A light beam incident on the surface of the semiconductor substrate 1 is converted into signal charges by the photoelectric conversion elements 2. The signal charges generated by individual photoelectric conversion elements 2 are sequentially transferred by the vertical transfer elements 3 to the horizontal transfer element 4, and are, in turn, sequentially transferred by the horizontal transfer element 4 to the output circuit 5. The output circuit 5 outputs an output signal to an output terminal T according to the amount of each signal charge received from the horizontal transfer element 4.

A prescribed drain voltage is applied on the drain terminal 6 which is connected to the output circuit 5. In general, the drain terminal 6 is electrically connected to a drain region of a MOSFET (not shown) in the output circuit 5. The potential of the drain of the MOSFET is kept constant. In addition, a gate of the MOSFET is connected to the one end of the horizontal transfer element 4, so that the potential of the gate of the MOSFET depends on the amount of each signal charge received from the horizontal transfer element 4. Therefore, the amount of each signal charge can be detected as a potential of a source of the MOSFET, or detected as a current flowing between the drain and the source.

A prescribed overflow drain voltage is applied on the overflow drain voltage input terminal 7 which is electrically connected to the semiconductor substrate 1 via the overflow drain voltage supply 8. The value of the overflow drain voltage is adjusted by an external voltage regulator unit 10 so as not to exceed the value of the drain voltage. An optimum value of the overflow drain voltage is determined so as to obtain a required level of an output signal from the output circuit 5.

For blooming suppression, the CCD type imaging device has an overflow drain structure formed in the semiconductor substrate 1. According to the overflow drain structure, overflow charges, which are generated in the photoelectric conversion elements 2 when an excessive light beam irradiates the photoelectric conversion elements 2, flow into the deep portion of the semiconductor substrate 1. Thus, blooming is prevented by the overflow drain structure. An example of such a overflow drain structure for blooming suppression, a vertical overflow drain (VOD) structure, is disclosed in detail in Japanese Patent Publication (KOKOKU) No. 59-17581.

The amount of overflow charges to be led into the semiconductor substrate 1 is adjusted by controlling the value of the overflow drain voltage which is applied by the external voltage regulator unit 10. The optimum value of the overflow drain voltage is not constant and varies from unit to unit of CCD type solid state imaging devices. Therefore, the value of the overflow drain voltage to be applied by users must be specified for each individual CCD solid state imaging device. This causes a problem that an adjustment of the value of the overflow drain voltage is required for each individual CCD type solid state imaging device when manufacturing video cameras and the like using the CCD type solid state imaging devices. In addition, it has been required that a voltage generating circuit 9 and the voltage regulator unit 10 must be externally provided for each CCD type solid state imaging device, which naturally leads to an increase in the cost of manufacturing video cameras and the like.

SUMMARY OF THE INVENTION

The CCD type solid state imaging device of this invention, which overcomes the above-discussed and numerous other disadvantages and deficiencies of the prior art, comprises: a semiconductor substrate having an electrically grounded region; photoelectric conversion means formed in said semiconductor substrate, said photoelectric conversion means receiving light and generating signal charges according to the intensity of said light; charge transfer means for receiving said signal charges and transferring said signal charges; an output circuit for receiving said signal charges from said charge transfer means and outputting output signals according to said signal charges; an input terminal formed at said semiconductor substrate, said input terminal receiving an input voltage; an overflow drain voltage supply formed in said semiconductor substrate, said overflow drain voltage supply receiving an overflow voltage and supplying said overflow voltage to said semiconductor substrate; an overflow drain path formed in said semiconductor substrate, overflow charges generated in said photoelectric conversion means flowing into a deep portion of said semiconductor substrate through said overflow drain path; and a first resistive layer and a second resistive layer which are disposed in series on said semiconductor substrate, said first resistive layer interconnecting said input terminal and said overflow drain voltage supply, and said second resistive layer interconnecting said overflow drain voltage supply and said electrically grounded region.

In a preferred embodiment, said photoelectric conversion means comprises photoelectric conversion elements arranged in a matrix pattern at said semiconductor substrate, said charge transfer means comprises: vertical transfer elements disposed adjacent to individual columns of said photoelectric conversion elements; and a horizontal transfer element connected to one end of each of the individual columns of said vertical transfer elements, and said output circuit is connected to one end of said horizontal transfer element.

In a preferred embodiment, said photoelectric conversion elements are photo-diodes formed in said semiconductor substrate, each of said photo-diodes comprising a pn junction constituted by a well layer of a first conductivity type formed in said semiconductor layer and a region of a second conductivity type formed in said well layer, and said overflow charges are generated in said region and flows into the deep portion of said semiconductor substrate through said well layer.

In a preferred embodiment, at least one of said first and second resistive layers are formed by a laser trimming technique for adjustment of the resistance ratio of said first resistive layer to said second resistive layers.

Thus, the invention described herein makes possible the objective of providing a CCD type solid state imaging device having a built-in overflow drain voltage generator, which can eliminate troublesome voltage adjusting operations in the process of manufacturing video cameras and the like, and can thus lower the cost of manufacturing such cameras or the like.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
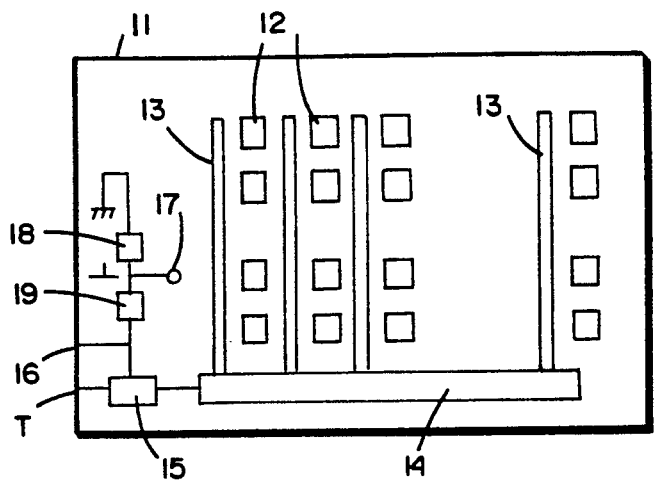
FIG. 1 is a schematic plan view of a CCD type solid state imaging device according to the invention.
Figure 2:
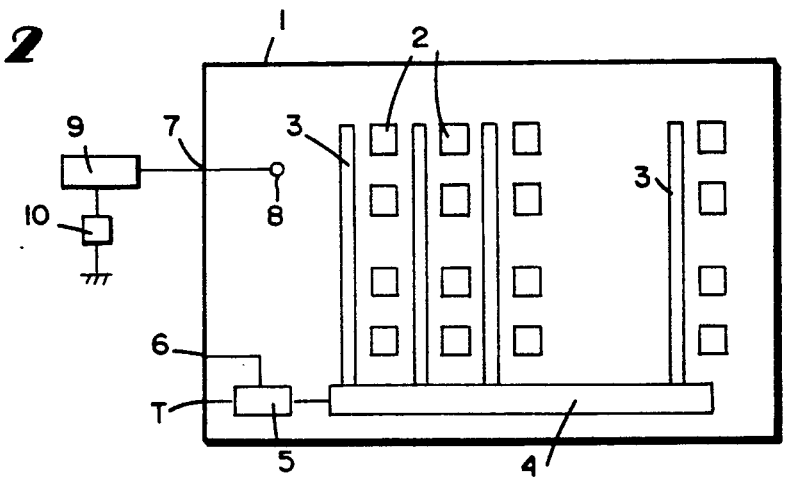
FIG. 2 is a schematic plan view of a prior art CCD type solid state imaging device.

FIG. 1 shows a CCD type solid state imaging device according to the invention. The CCD type solid state imaging device comprises: a semiconductor substrate (an n-type silicon substrate) 11 having a grounded region; photoelectric conversion elements (photo-diodes) 12 arranged in a matrix pattern at the semiconductor substrate 11; vertical transfer elements 13 disposed adjacent to individual columns of the photoelectric conversion elements 12; a horizontal transfer element 14 connected to one end of each of the individual columns of the vertical transfer elements 13; and an output circuit 15 connected to one end of the horizontal transfer element 14. Each element of the horizontal transfer element 14 and vertical transfer elements 13 has a CCD structure.

This CCD type solid state imaging device further comprises: an input terminal (drain terminal) 16 connected to a drain of a MOSFET (not shown) in the output circuit 15; an overflow drain voltage supply 17 formed in the semiconductor substrate 1; and a first resistive layer 19 and a second resistive layer 18 which are disposed in series on the semiconductor substrate 11. The first resistive layer 19 interconnects the drain terminal 16 and the overflow drain voltage supply 17. The second resistive layer 18 interconnects the overflow drain voltage supply 17 and the grounded region provided within the semiconductor substrate 11.

A light beam incident on the surface of the semiconductor substrate 11 is converted into signal charges by the photoelectric conversion elements 12. The signal charges generated by individual photoelectric conversion elements 12 are sequentially transferred by the vertical transfer elements 13 to the horizontal transfer element 14, and are, in turn, sequentially transferred by the horizontal transfer element 14 to the output circuit 15.

The output circuit 15 outputs an output signal to an output terminal T according to each signal charge received from the horizontal transfer element 14. A gate of the MOSFET in the output circuit 15 is connected to the one end of the horizontal transfer element 14, so that a potential of the gate of the MOSFET depends on the amount of each signal charge received from the horizontal transfer element 14. The amount of each signal charge can be detected as a potential of a source of the MOSFET, or detected as a current flowing between the drain and the source.

In this embodiment, a p-well layer is formed in the semiconductor substrate 11, and n+-type regions are formed in the p-well layer, to make n+p-type photo-diodes as the photoelectric conversion elements 12. As a result, the overflow charges generated in the n+-type regions flow into the semiconductor substrate 11 through n+pn junctions (or n+pn type parasitic bipolar transistor), in response to the potential of the n+-type regions and the value of the overflow drain voltage. Such a structure itself is well known as a vertical overflow drain structure. Thus, in this embodiment, the n+pn junctions serve as an overflow drain path through which the overflow charges flow into the semiconductor substrate 11.

In the CCD type solid state imaging device of the embodiment, the overflow drain voltage is generated within the device by dividing the prescribed drain voltage (which is applied from an external source to the drain terminal 16) by a divider. The divider comprises the first resistive layer 19 interconnecting the drain terminal 16 and the overflow drain voltage supply 17, and the second resistive layer 18 interconnecting the overflow drain voltage supply 17 and the grounded area within the semiconductor substrate 11. In other words, the overflow drain voltage is generated in a built-in overflow drain voltage generator of the CCD type imaging device itself.

The resistive layers 19 and 18 are formed by, for example, a laser trimming technique in the process of fabricating the CCD type solid state imaging device so that the value of the overflow drain voltage is set to be an optimum value. According to the laser trimming technique, after a resistive layer pattern (e.g., a polysilicon or metal layer pattern) is formed over the semiconductor substrate 11 in known manners, selected portions of the resistive layer pattern are cut by using a laser beam, so as to make the resistive layers 19 and 18 each having a required resistance. More specifically, the required resistance ratio of the first resistive layer 19 to the second resistive layer 18 for obtaining the optimum value of the overflow drain voltage is made.

Thus, the setting of the value of the overflow drain voltage is performed by controlling the resistance ratio of the first resistive layer 19 to the second resistive layer 18 in the process of fabricating the CCD type solid state imaging device. This eliminates the need for such troublesome voltage adjusting operations required in the process of manufacturing video cameras or the like. Thus, it is possible to reduce the cost of manufacturing such camera or the like, by using the CCD type solid state imaging device of the invention.

Figure 3:
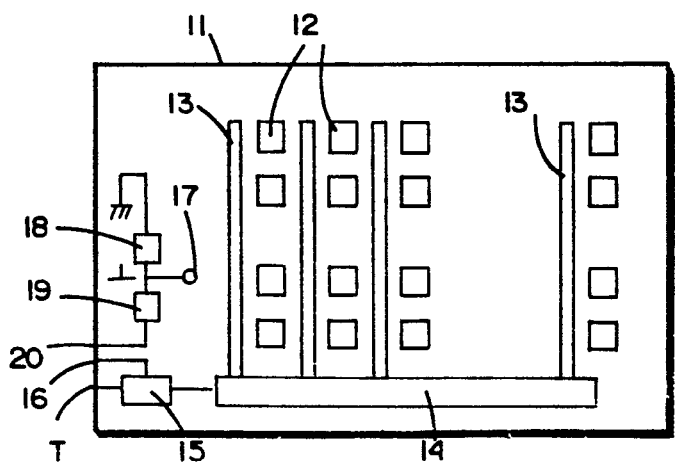
FIG. 3 is a schematic plan view of another CCD type solid state imaging device according to the invention.

FIG. 3 shows another CCD type solid state imaging device (a second embodiment) according to the invention. The second embodiment differs from the first embodiment in that the second embodiment has a second input terminal 20 in addition to the first input terminal (drain terminal) 16. According to the second embodiment, the overflow drain voltage is generated within the device itself by dividing the voltage applied on the second input terminal 20 by a divider. The divider comprises the first resistive layer 19 interconnecting the second input terminal 20 and the overflow drain voltage supply 17, and the second resistive layer 18 interconnecting the overflow drain voltage supply 17 and the grounded region within the semiconductor substrate 11.

According to the second embodiment, as well as the first embodiment, the need for such troublesome voltage adjusting operations as hitherto required in the process of manufacturing video cameras or the like is eliminated. Therefore, it is possible to reduce the cost of manufacturing such cameras or the like, by using the CCD type solid state imaging device of the invention.

As apparent from the above, in the CCD type solid state imaging device according to the present invention, the overflow drain voltage is generated within the device itself by dividing the prescribed voltage by a built-in divider. Since the resistance ratio the first resistive layer to the second resistive layer is adjusted in the process of manufacturing the CCD type solid imaging device, the need for such troublesome voltage adjusting operations as may be otherwise required in the process of manufacturing video cameras or the like is eliminated. Accordingly, the cost of manufacturing such cameras or the like can be reduced.

While the invention has been described with respect to the CCD type solid state imaging device having a vertical overflow drain (VOD) structure, the invention is applicable for a CCD type solid state imaging device having another type overflow drain structure.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A CCD type solid state imaging device, comprising:
   a semiconductor substrate having an electrically grounded region;
   photoelectric conversion means formed in said semiconductor substrate, said photoelectric conversion means receiving light and generating signal charges according to the intensity of said light;
   charge transfer means for receiving said signal charges and transferring said signal charges;
   an output circuit for receiving said signal charges from said charge transfer means and outputting output signals according to said signal charges;
   an input terminal formed at said semiconductor substrate, said input terminal receiving an input voltage;
   an overflow drain voltage supply formed in said semiconductor substrate, said overflow drain voltage supply receiving an overflow voltage and supplying said overflow voltage to said semiconductor substrate;
   an overflow drain path formed in said semiconductor substrate, overflow charges generated in said photoelectric conversion means flowing into a deep portion of said semiconductor substrate through said overflow drain path; and
   a first resistive layer and a second resistive layer which are disposed in series on said semiconductor substrate, said first resistive layer interconnecting said input terminal and said overflow drain voltage supply, and said second resistive layer interconnecting said overflow drain voltage supply and said electrically grounded region.

2. A CCD type solid state imaging device according to claim 1, wherein said photoelectric conversion means comprises photoelectric conversion elements arranged in a matrix pattern at said semiconductor substrate, said charge transfer means comprises: vertical transfer elements disposed adjacent to individual columns of said photoelectric conversion elements; and a horizontal transfer element connected to one end of each of the individual columns of said vertical transfer elements, and said output circuit is connected to one end of said horizontal transfer element.

3. A CCD type solid state imaging device according to claim 2, wherein said photoelectric conversion elements are photo-diodes formed in said semiconductor substrate, each of said photo-diodes comprising a pn junction constituted by a well layer of a first conductivity type formed in said semiconductor layer and a region of a second conductivity type formed in said well layer, and said overflow charges are generated in said region and flow into the deep portion of said semiconductor substrate through said well layer.

4. A CCD type solid state imaging device according to claim 1, wherein at least one of said first and second resistive layers are formed by a laser trimming technique for adjustment of the resistance ratio of said first resistive layer to said second resistive layer.

* * * * *